United States Patent [19]

Uchikawa

[11] Patent Number: 5,637,426
[45] Date of Patent: Jun. 10, 1997

[54] METHOD AND APPARATUS FOR FORMING RESIST PATTERN, AND PRINTED WIRING BOARD FABRICATED THEREBY

[75] Inventor: Katsumi Uchikawa, Kawasaki, Japan

[73] Assignee: Fujitsu, Ltd., Kawasaki, Japan

[21] Appl. No.: 542,328

[22] Filed: Oct. 12, 1995

[30] Foreign Application Priority Data

Oct. 25, 1994 [JP] Japan .................. 6-260694

[51] Int. Cl.$^6$ .................................................. G03F 7/00
[52] U.S. Cl. .................. 430/9; 430/311; 430/319; 430/327; 428/901; 427/96
[58] Field of Search .................. 430/9, 11, 311, 430/396, 5, 319, 322, 327; 428/901; 427/466, 504, 58, 96

[56] References Cited

U.S. PATENT DOCUMENTS 4,767,489  8/1988  Lindner .................. 156/345
4,853,317  8/1989  Hayes .................... 430/318
5,466,653  11/1995  Ma ...................... 503/200

FOREIGN PATENT DOCUMENTS 5-338187  12/1993  Japan .

*Primary Examiner*—Kathleen Duda
*Attorney, Agent, or Firm*—Staas & Halsey

[57] ABSTRACT

A method for forming a resist pattern comprising the steps of: placing a transparent mask substrate on an object coated with a resist; drawing a mask pattern directly on the transparent mask substrate with an ink jetter; exposing the resist to light with intervention of the mask pattern; peeling off the mask substrate; and developing the resist, thereby forming a predetermined resist pattern.

8 Claims, 4 Drawing Sheets

METHOD AND APPARATUS FOR FORMING RESIST PATTERN, AND PRINTED WIRING BOARD FABRICATED THEREBY

BACKGROUND OF THE INVENTION

1. Field of the Invention

The present invention relates to a method and apparatus for forming a resist pattern, and a printed wiring board fabricated thereby. More particularly, the invention relates to a method and apparatus for forming a resist pattern necessary for circuit formation, and a printed wiring board fabricated thereby.

2. Description of Related Art

When a predetermined pattern is formed on an object, a resist is generally used. The fabrication of a printed wiring board, for example, utilizes a solder resist formation process to form a circuit pattern. This process comprises several steps each requiring a corresponding jig.

A conventional method for forming a solder resist pattern will hereinafter be described briefly with reference to FIG. 4.

A printed wiring board formed with a surface layer in a surface layer forming step 51 is subjected to six steps for the formation of a solder resist pattern on the surface of the printed wiring board, which include: a pretreatment step 52 of polishing the surface layer to improve the adhesiveness of a solder resist to the surface layer; an electrostatic coating step 53 of coating the surface layer with the solder resist; a preliminary drying step 54 of evaporating a solvent; an exposure step 55 of exposing the printed wiring board to light with a predetermined artwork mask; a development step 56 of removing an unexposed portion (in which etching may be also employed); and a heat curing step 57 of curing the solder resist. In the exposure step, a plurality of artwork masks are required for respective circuit designs.

The process for preparing an artwork mask comprises the steps of: coating a 0.2 µm- to 0.3 µm-thick transparent substrate such as of polyethylene with a photosensitive material of a silver salt such as silver bromide; exposing the photosensitive material to light by way of laser drawing, and developing the photosensitive material for the formation of a predetermined pattern; coating the transparent substrate with a protective film for the protection of the pattern; forming a reference hole; and inspecting the resultant artwork mask.

For Example, Japanese Patent Unexamined Patent Application No. Hei 5(1993)-338187 discloses a method for forming a resist pattern wherein an image signal for a resist pattern to be formed is sent to a ink-jet printer for printing the resist pattern on a printed wiring board. The above method, however, cannot form a uniform resist pattern on a printed wiring board which has a plurality of through holes. For the diameter of a through hole is larger than that of a ink droplet jetted by the ink-jet printer, which allows ink droplets into through holes. The through holes thus stuffed with ink droplets degrade quality of the printed wiring board.

As described above, the process for forming a solder resist pattern includes a multiplicity of steps and, hence, requires equipment and quality control consideration for each of the steps. Different artwork masks are required for different circuit designs. One printed wiring board generally includes an inner layer circuit, surface layer circuit, solder resist circuit and a like circuit, thereby requiring a plurality of artwork masks having different patterns for the formation of the respective circuits. The use of the artwork masks imposes additional requirements for quality control, cost and storage of themselves. Further, each light exposure requires placement and registration of an artwork mask on a circuit board, thus resulting in limited registration accuracy.

In the technical fields other than the printed wiring board technology, for example, the field of semiconductor devices, preliminarily patterned masks are required for the formation of predetermined patterns on a substrate, presenting the same problem as that of the aforesaid artwork masks.

SUMMARY OF THE INVENTION

In accordance with one aspect of the present invention, there is provided a method for forming a predetermined resist pattern, comprising the steps of: placing a transparent mask substrate on an object coated with a resist; drawing a mask pattern directly on the transparent mask substrate with an ink jetter; exposing the resist to light with intervention of the mask; peeling off the mask substrate; and developing the resist.

In accordance with another aspect of the present invention, there is provided an apparatus for forming a resist pattern comprising: coating means for coating an object with a resist; placement means for placing a transparent mask substrate on the resist; an ink jetter for drawing a mask pattern for resist pattern formation on the transparent mask substrate; data accumulation means for accumulating mask data; production instruction control means for sending data in the data accumulation means to the ink jettar; control means for controlling the ink jetter; exposure means for exposing the resist to light; peeling means for pealing off the transparent mask substrate; and development means for developing the resist.

The present invention is characterized in that a transparent mask substrate is placed on an object coated with a resist and then a mask pattern is drawn directly on the transparent mask substrate by means of an ink jettar without using a conventional mask prepared in a separate process.

DESCRIPTION OF THE PREFERRED EMBODIMENTS

A method for forming a resist pattern in accordance with the present invention is applicable to any processes which include a step of patterning a resist, for example, patterning of an inner layer circuit, surface layer circuit, solder resist circuit and the like performed in a process for fabricating a printed wiring board, patterning of an impurity implant region, electrode and the like performed in a process for fabricating a semiconductor device, and patterning of an electrode and the like in a process for fabricating a liquid crystal display device.

Exemplary objects to be used as an object in the present invention include a printed wiring board, a semiconductor substrate, and a transparent substrate such as of glass or plastic usually employed for a liquid crystal display.

A desired region of the object is coated with a resist. Exemplary coating methods include coating by means of a spin coater, roller coater and the like, electrostatic coating, and press coating of a resist film preliminarily formed. The coating method to be employed varies depending on the object to be used.

Usable as the resist are those known in the fields to which the present invention is applied, for example, ultraviolet-curing resins such as phenolic resins, styrene resins and isoprene resins. The resist may be either of a negative type or of a positive type.

In turn, a transparent mask substrate is placed on the object coated with the resist. Though any of known transparent substrates can be used as the transparent mask substrate without any particular limitations, the transparent mask substrate preferably has a high transparency and a high light transmittance. Exemplary transparent mask substrates include a thin glass plate and plastic films such as made of polyethylene, polyethylene terephthalate and polypropylene.

When a plastic film is to be used, the thickness thereof is preferably 20 um to 50 um, which can prevent light scattering and breakage when peeled off. The plastic film may be disposable. Exemplary commercially available one is Mylar Sheet made of polyester.

When a glass plate is to be used, the thickness thereof is preferably about 1 mm in consideration of the strength. Ink applied on the glass plate can be washed away with a known solvent and, therefore, the glass plate can be repeatedly used.

Figure 2:
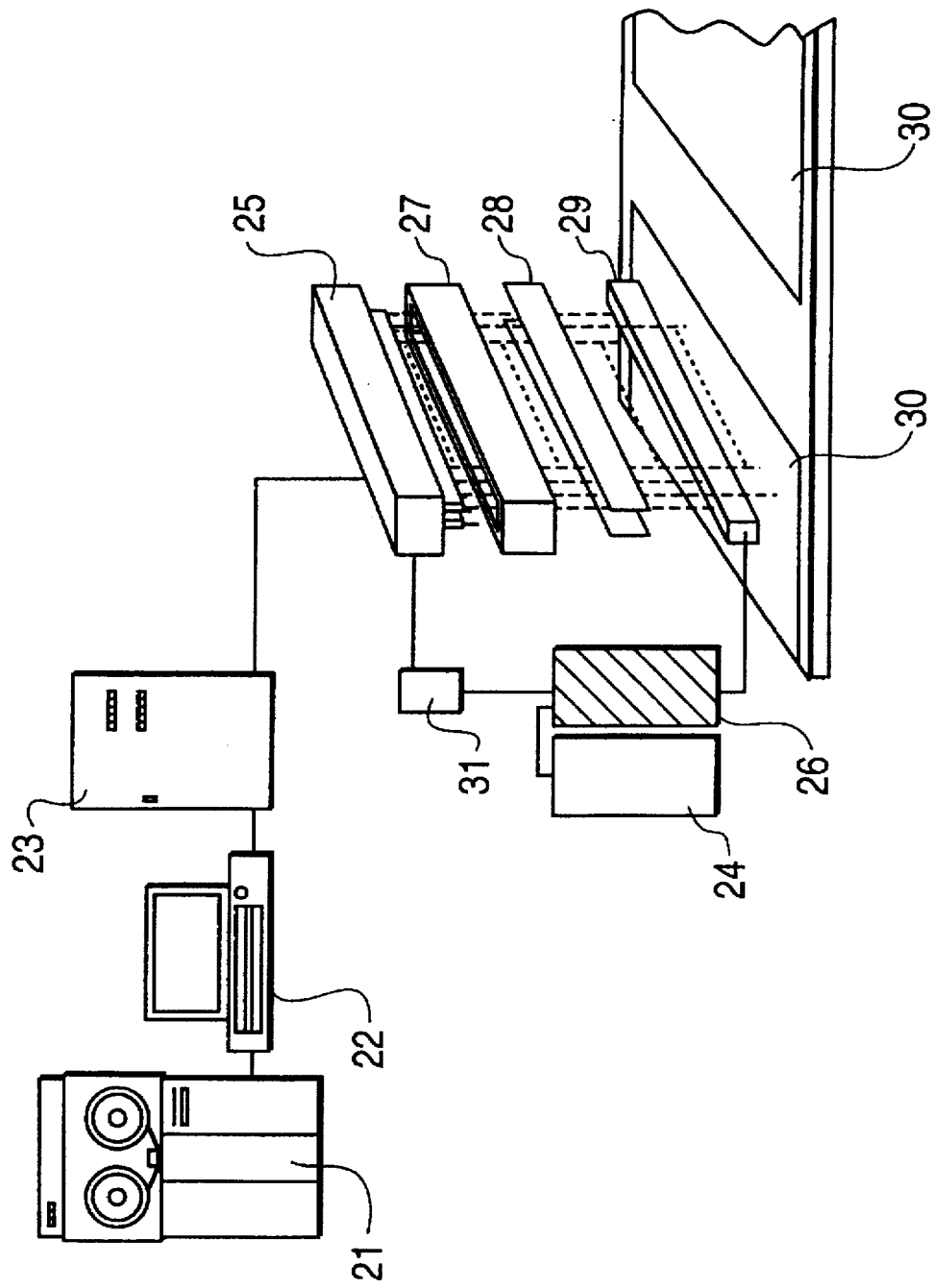
FIG. 2 is a schematic diagram illustrating an ink jetter usable for the resist pattern formation method of the present invention.

Using an ink jetter, an ink is drawn onto a region of the mask substrate corresponding to a region of the object from which the resist is to be removed. The ink thus applied serves as a mask. The ink jetter to be used in the present invention is not particularly limited, but an ink jet printer as shown in FIG. 2 can be used. With reference to FIG. 2, an explanation will be given to an apparatus for forming a resist pattern in accordance with the present invention.

Mask pattern data accumulated in data accumulation means 21 is sent to production instruction control means 22, and further sent to the ink jetter via control means 23. The ink jetter applies ink onto the mask substrate placed on the object 30, based on the mask pattern data. The ink jet printer shown in FIG. 2 includes a solvent tank 24 filled with solvent, an ink tank 26 having a jet nozzle 25, a band electrode 27, a deflector plate 28, girder 29 and a circulation pump 31 for circulating the ink. Though the ink jetter shown in FIG. 2 is of an on-demand-type multi-nozzle structure, an ink jetter having a head of continuous type can otherwise be used. The ink for ink jetter to be used for the drawing of a mask pattern in the present invention is not particularly limited, but those capable of blocking light, such as a ketone-based dye-type ink can be used. The color of the ink is preferably black in consideration of light blocking ability.

Next, only a region in which a resist pattern is to be formed is exposed to light by emitting light onto the object by light exposure means. The light source to be used for light exposure is preferably capable of emitting parallel light rays to prevent undercut of the resist pattern. The wavelength of the light may be suitably selected from spectrum range of far-ultraviolet radiation, intermediate-ultraviolet radiation and near-ultraviolet radiation, depending on the type of resist to be used.

After the transparent mask substrate is peeled off by peeling means, the resist is developed by development means. Thus, a resist pattern is formed. Thereafter, the resist thus patterned may be cured, as required, in a heat drying step.

Where a glass plate is used as the transparent mask substrate in the aforesaid formation process, the apparatus further comprises means for removing the mask formed on the glass plate with a solvent and means for transporting the glass plate to the placement means, thereby making the glass plate reusable. The mask removing means includes, for example, means for applying an external force by water jet, brushing or the like to remove the mask softened by an alkaline solution or the like.

Figure 1:
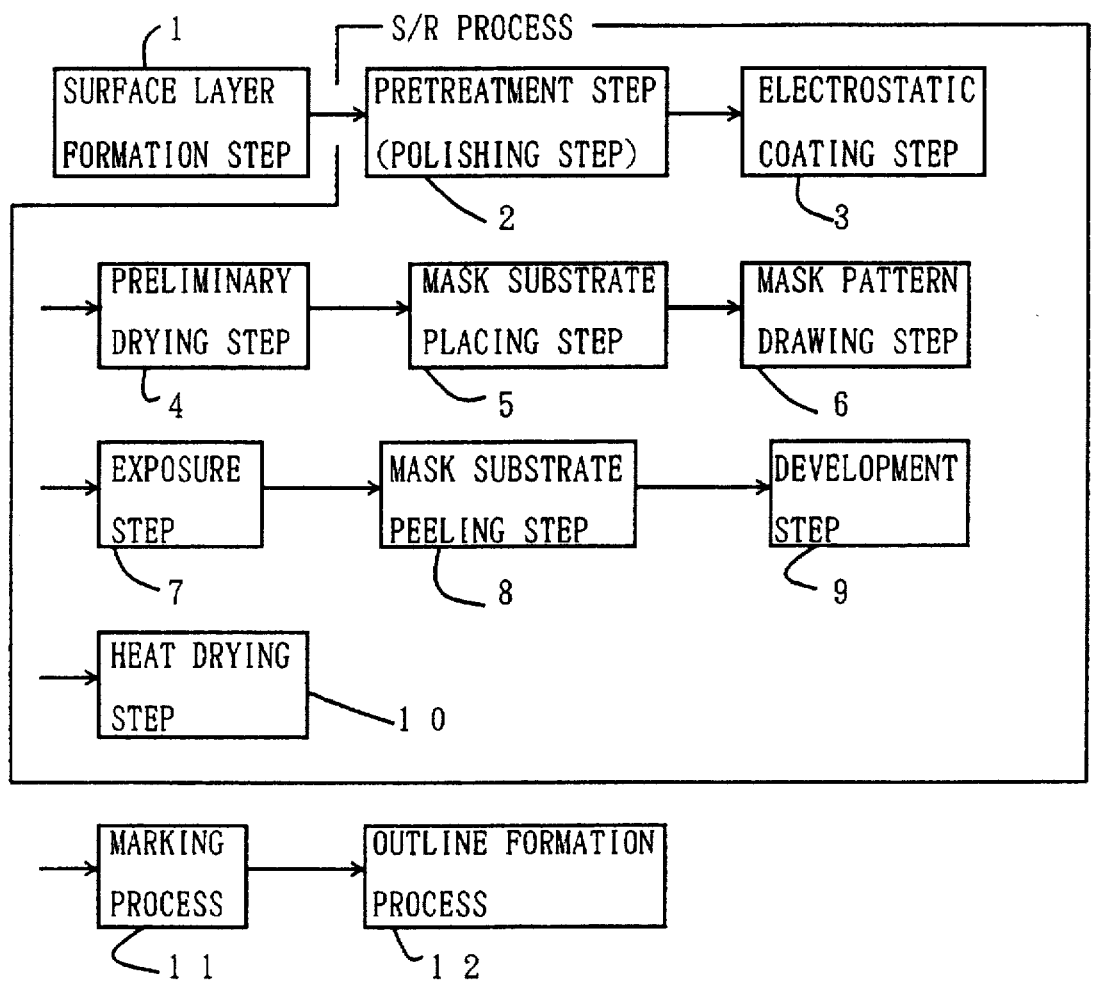
FIG. 1 is an explanatory diagram for illustrating a resist pattern formation method in accordance with the present invention.

There will next be explained an exemplary process for fabricating a printed wiring board using the resist pattern formation method of the present invention with reference to FIG. 1.

A printed wiring board formed with a surface layer in a surface layer formation step 1 is subjected to a pretreatment step 2 of polishing the surface layer of the printed wiring board to improve the adhesiveness of a solder resist to the surface layer. In turn, the entire surface of the printed wiring board is coated with a solder resist by coating means in a coating step. The solder resist to be used is not particularly limited, but any known solder resists can be used. The coating method is preferably electrostatic coating step 3. After the solder resist is preliminarily dried in a preliminary drying step 4, a transparent mask substrate is placed on the solder resist by placement means in a placement step 5.

In a subsequent mask pattern drawing step 6, an ink which serves as a mask is drawn onto a region of the transparent mask substrate corresponding to a region of the printed wiring board from which the solder resist is to be removed, by using an ink jetter.

Only a region in which a solder resist pattern is to be formed is exposed to light by emitting light onto the entire surface of the printed wiring board with exposure means in an exposure step 7. The light source to be used for exposure is preferably capable of emitting parallel light rays to prevent undercut of the solder resist pattern.

After the transparent mask substrate is peeled off by peeling means in a peeling step 8, the solder resist is developed by development means in a development step 9. Thus, a printed wiring board formed with a predetermined solder resist pattern is obtained. The solder resist may be cured by heat drying in a heat drying step 10. The printed wiring board is thereafter subjected to a known marking process 11 and outline formation process 12.

The present invention dispenses with a mask such as an artwork mask which is conventionally prepared in a separate process, and allows the mask formation step to be incorporated in an object fabricating process. Therefore, the process can be simplified, thereby meeting requirements for lower cost and shorter delivery term. Since the mask is directly formed in the process, the registration of the mask can be achieved for each object, thereby improving the exposure accuracy.

The resist pattern formation method of the present invention does not require a mask such as an artwork mask which is conventionally prepared in a separate process, thereby realizing the streamlining of the process and cost down. Since the mask pattern is directly drawn by means of the ink jetter, the registration accuracy of the mask can be improved, and requirements for small-lot production of multiple items can be satisfied.

The resist pattern formation method can be further simplified by using a transparent mask substrate selected from a polyethylene film, polyethylene terephthalate film and polypropylene film.

The fabrication cost can be further reduced by reusing the glass plate from which the mask is removed with a solvent after the glass plate is used for the exposure of the pattern.

The apparatus for forming a resist pattern in accordance with the present invention is not required to prepare a mask in a separate process, and allows for the formation of a resist pattern in a single process sequence.

The apparatus for forming a resist pattern further comprising the removing means for removing a mask formed on a glass plate with a solvent and the transportating means for transporting the glass plate to the placement means can easily reuse the glass plate.

EXAMPLE

An example of the present invention in which a printed wiring board is used as an object will hereinafter be described. It should be noted that the example is not limitative of the present invention.

Figure 3:
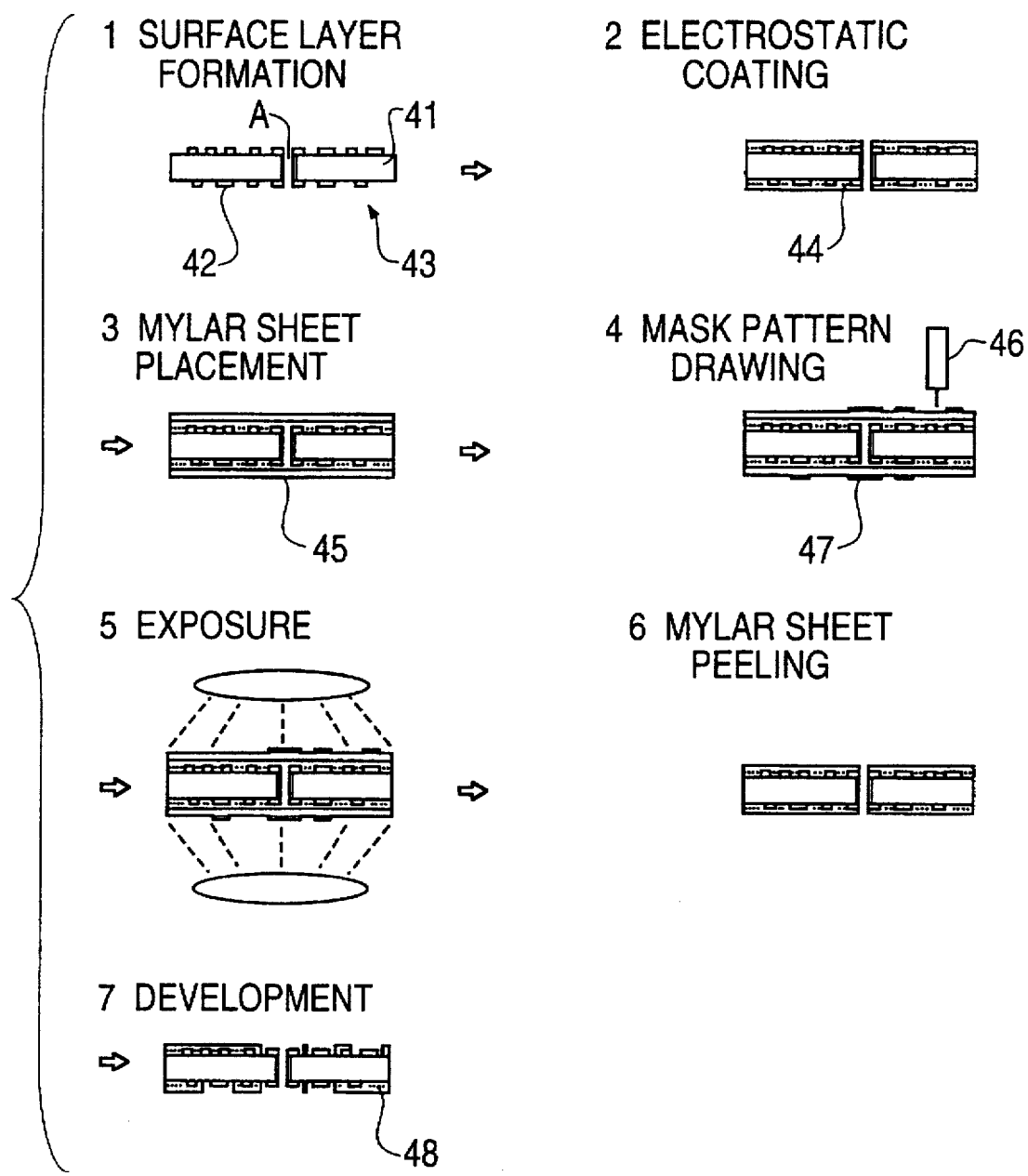
FIG. 3(1) to 3(7) are schematic sectional views for illustrating a method for fabricating a printed wiring board in accordance with one embodiment of the present invention.
Figure 4:
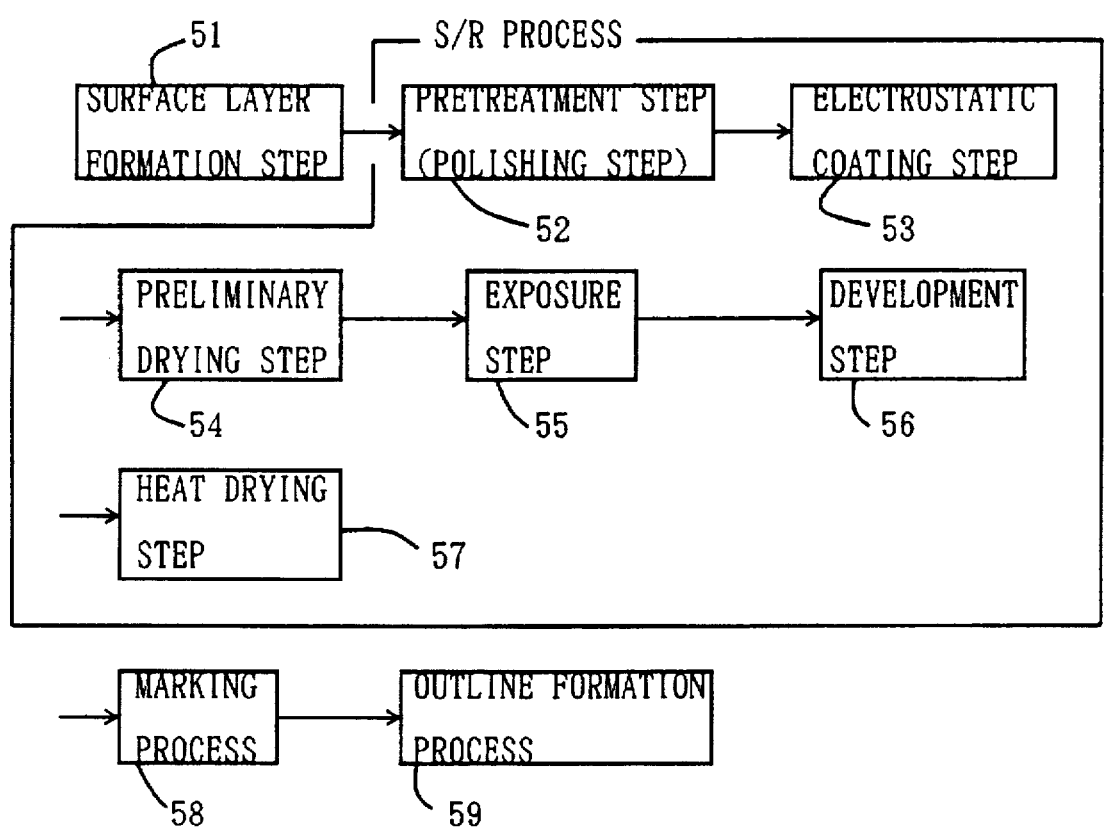
FIG. 4 is an explanatory diagram for illustrating a conventional method for fabricating a printed wiring board.

FIG. 3 is a diagram illustrating a process for fabricating a printed wiring board in accordance with the present invention.

As shown, the printed wiring board fabrication process in accordance with the present invention includes a surface layer formation step in which a substrate 41 having a through hole A is formed with a surface layer 42 having a foot print and through-holes to fabricate a printed wiring board 43.

To improve the adhesiveness of a solder resist to the printed wiring board 43, the printed wiring board 43 is polished in a pretreatment step. Then, a solder resist 44 is coated on the entire surface of the printed wiring board 43 in an electrostatic coating step, and preliminarily dried.

In turn, Mylar sheet 45 is placed on the solder resist 44, and a mask pattern is drawn with an ink by means of an ink jet printer 46 shown in FIG. 2 (serving as an ink jetter) on a region of the Mylar sheet 45 corresponding to a region of the printed wiring board 43 from which the solder resist 44 is to be removed. Then, the entire surface of the printed wiring board 43 is exposed to light.

The Mylar sheet 45 is peeled off, and the solder resist 44 is developed. The solder resist covered with the mask 45 which is unexposed to light and therefore is not cured is removed. Thus, a printed wiring board formed with a solder resist pattern 48 is obtained.

As stated above, the resist pattern formation method of the present invention does not require a mask such as an artwork mask which is conventionally formed in a separate process, thereby greatly contributing to time and labor saving and cost reduction. Since the mask pattern is directly drawn by means of the ink jetter, the registration accuracy of the mask can be improved, and requirements for small-lot production of multiple items can be satisfied.

The fabrication method can be further simplified by using a transparent mask substrate selected from a polyethylene film, polyethylene terephthalate film and polypropylene film. The fabrication cost can be further reduced by reusing the transparent glass plate from which the mask is removed with a solvent after the glass plate is used for the exposure of the pattern.

The apparatus for forming a resist pattern in accordance with the present invention is not required to prepare a mask in a separate process, and allows for the formation of a resist pattern in a single process sequence.

The apparatus for forming a resist pattern further comprising the means for removing a mask formed on a glass plate with a solvent and the transportation means for transporting the glass plate to the placement means can easily reuse the glass plate.

What is claimed is:

1. A method for forming a resist pattern comprising the steps of:

placing a transparent mask substrate on an object coated with a resist, object having a plurality of through holes;

after placing the transparent mask substrate on the object, drawing a mask pattern directly on the transparent mask substrate with an ink jet printer;

exposing the transparent mask substrate with the mask pattern drawn thereon to incident light thereby selectively exposing the resist coated on the object to light;

removing the mask substrate; and developing the resist, thereby forming a predetermined resist pattern.

2. A method as set forth in claim 1, wherein the object is a printed wiring board, and wherein the resist is a solder resist.

3. A method as set forth in claim 1, wherein the transparent mask substrate is a glass plate, and the glass plate is reused by removing the mask with a solvent after the glass plate is used for the exposure of the pattern.

4. A method as set forth in claim 1, wherein the transparent mask substrate is selected from the group consisting of a polyethylene film, a polyethylene terephthalate film and a polypropylene film.

5. A method as set forth in claim 1, wherein the transparent substrate is a glass plate.

6. A printed wiring board formed with a predetermined solder resist pattern obtainable by a resist pattern formation method comprising the steps of:

placing a transparent mask substrate on a printed wiring board coated with a resist, the printed wiring board having a plurality of through holes;

after placing the transparent mask substrate on the printed wiring board, drawing a mask pattern directly on the transparent mask substrate with an ink jet printer;

exposing the transparent mask substrate with the mask pattern drawn thereon to incident light thereby selectively exposing the resist coated on the printed wiring board to light;

removing the mask substrate; and developing the resist.

7. A printed wiring board as set forth in claim 6, wherein the transparent mask substrate is selected from the group consisting of polyethylene film, a polyethylene terephthalate film and a polypropylene film.

8. A printed wiring board as set forth in claim 6, wherein the transparent mask substrate is a glass plate.

* * * * *

UNITED STATES PATENT AND TRADEMARK OFFICE
CERTIFICATE OF CORRECTION

PATENT NO. : 5,637,426
DATED : June 10, 1997
INVENTOR(S) : Katsumi UCHIKAWA

It is certified that error appears in the above-indentified patent and that said Letters Patent is hereby corrected as shown below:

COL. 6, line 16, after "resist," insert --the--

Signed and Sealed this

Nineteenth Day of August, 1997

Attest:

BRUCE LEHMAN

Attesting Officer

Commissioner of Patents and Trademarks